(12) United States Patent
Taub et al.

(10) Patent No.: US 11,204,559 B2
(45) Date of Patent: Dec. 21, 2021

(54) HIGH STABILITY COLLIMATOR ASSEMBLY, LITHOGRAPHIC APPARATUS, AND METHOD

(71) Applicant: ASML Holding N.V., Veldhoven (NL)

(72) Inventors: David Taub, Stamford, CT (US); Joseph Ashwin Franklin, Norwalk, CT (US); Jeffrey John Kowalski, Bethel, CT (US)

(73) Assignee: ASML Holdings N.V., Veldhoven (NL)

(*) Notice: Subject to any disclaimer, the term of this patent is extended or adjusted under 35 U.S.C. 154(b) by 0 days.

(21) Appl. No.: 17/054,313

(22) PCT Filed: May 2, 2019

(86) PCT No.: PCT/EP2019/061183
§ 371 (c)(1),
(2) Date: Nov. 10, 2020

(87) PCT Pub. No.: WO2019/219389
PCT Pub. Date: Nov. 21, 2019

(65) Prior Publication Data
US 2021/0072654 A1    Mar. 11, 2021

Related U.S. Application Data

(60) Provisional application No. 62/672,260, filed on May 16, 2018.

(51) Int. Cl.
*G03F 7/20* (2006.01)
*G03F 9/00* (2006.01)
(Continued)

(52) U.S. Cl.
CPC ......... *G03F 9/7065* (2013.01); *G02B 6/3616* (2013.01); *G03F 9/7096* (2013.01); *G02B 7/008* (2013.01)

(58) Field of Classification Search
CPC .. G03F 9/7065; G03F 9/7096; G03F 7/70716; G03F 9/7088; G03F 7/70691;
(Continued)

(56) References Cited

U.S. PATENT DOCUMENTS 4,193,664 A  *  3/1980  Ellwood  .............. G02B 6/3843
                                                     385/65
6,297,876 B1    10/2001 Bornebroek
(Continued)

FOREIGN PATENT DOCUMENTS

EP    1 111 473 A2    6/2001
EP    1 179 746 A2    2/2002

OTHER PUBLICATIONS

International Search Report and Written Opinion of the International Searching Authority directed to related International Patent Application No. PCT/EP2019/061183, dated Sep. 16, 2019; 12 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

A lithography system comprises an illumination system configured to produce a beam of radiation, a support configured to support a patterning device configured to impart a pattern on the beam, a projection system configured to project the patterned beam onto a substrate, and an alignment system comprising an illuminator. The illuminator comprises an optical fiber, an optical fiber protector (714), an optical fiber support (700) comprising a first support arm assembly configured to support the optical fiber protector, an optical system, and an optical system support comprising a second support arm assembly configured to support the optical system.

20 Claims, 12 Drawing Sheets

(51) Int. Cl.
*G02B 6/36* (2006.01)
*G02B 7/00* (2021.01)

(58) Field of Classification Search
CPC .. G03F 9/7046; G03F 7/7085; G03F 7/70141; G03F 7/70625; G03F 7/70775; G03F 7/70633; G03F 9/7069; G03F 7/70075; G03F 9/7049; G03F 7/70616; G03F 7/709; G03F 7/70191; G03F 7/7065; G03F 7/70641; G03F 9/7011; G03F 7/70116; G03F 7/70108; G03F 7/70891; G03F 9/7019; G03F 7/70225; G03F 7/70308; G03F 7/70483; G02B 6/3616; G02B 7/008; G02B 6/4226; G02B 6/262; G03B 27/54; G01N 21/8806; G01B 11/14
See application file for complete search history.

(56) References Cited

U.S. PATENT DOCUMENTS

| | | | |
|---|---|---|---|
| 6,661,962 | B1 | 12/2003 | Calvet et al. |
| 6,961,116 | B2 | 11/2005 | Den Boef et al. |
| 7,511,799 | B2 | 3/2009 | Tel et al. |
| 7,526,162 | B1 | 4/2009 | Grapov et al. |
| 8,706,442 | B2 | 4/2014 | Mos et al. |
| 2007/0183063 | A1 | 8/2007 | Zengerling et al. |
| 2008/0218721 | A1 | 9/2008 | Schoeppach et al. |
| 2009/0195768 | A1 | 8/2009 | Bijnen et al. |
| 2010/0091296 | A1 | 4/2010 | De Groot et al. |
| 2011/0109891 | A1* | 5/2011 | Farnsworth ......... G03F 7/70825 355/67 |
| 2014/0016897 | A1* | 1/2014 | Glenn ....................... G02B 6/32 385/33 |
| 2016/0041361 | A1 | 2/2016 | Ison |
| 2017/0060003 | A1* | 3/2017 | Miyazaki .............. G03F 9/7065 |
| 2018/0074269 | A1 | 3/2018 | Meinl et al. |

OTHER PUBLICATIONS

International Preliminary Report on Patentability directed to related International Patent Application No. PCT/EP2019/061183, dated Nov. 17, 2020; 8 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, 1997; pp. 361-368.

Niu, et al., "Specular Spectroscopic Scatterometry in DUV Lithography," Proc. SPIE, vol. 3677, Metrology, Inspection, and Process Control for Microlithography XIII, Jun. 14, 1999; 10 pages.

* cited by examiner

HIGH STABILITY COLLIMATOR ASSEMBLY, LITHOGRAPHIC APPARATUS, AND METHOD

CROSS-REFERENCE TO RELATED APPLICATIONS

This application claims priority of U.S. Provisional Patent Application No. 62/672,260, which was filed on May 16, 2018, and which is incorporated herein in its entirety by reference.

FIELD

The present disclosure relates to alignment apparatuses and systems, for example, alignment source for lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Alignment assemblies require precision over varying environmental conditions. Accordingly, there is a need to provide an optical alignment assembly that mitigates misalignment regardless of environmental conditions.

SUMMARY

In one example, a lithography system comprises an illumination system configured to produce a beam of radiation, a support configured to support a patterning device configured to impart a pattern on the beam, a projection system configured to project the patterned beam onto a substrate, and an alignment system comprising an illuminator. In one example, the illuminator comprises an optical fiber, an optical fiber protector, an optical fiber support comprising a first support arm assembly configured to support the optical fiber protector, an optical system, and an optical system support comprising a second support arm assembly configured to support the optical system.

In one example, an illuminator comprises an optical fiber, an optical fiber protector, an optical fiber support comprising a first support arm assembly configured to support the optical fiber protector, an optical system, and an optical system support comprising a second support arm assembly configured to support the optical system. In one example, the optical fiber and optical system supports are modular and coupled such that an optical fiber and the optical system are aligned.

In one example, a method for supporting alignment critical optical components comprises supporting an optical fiber using an optical fiber support comprising a first support arm assembly configured to exert a first contact pressure on an optical fiber protector and supporting an optical system using an optical system support comprising a second support arm assembly configured to exert a second contact pressure on the optical system. In one example, the optical fiber and optical system supports are coupled such that the optical fiber and optical system are aligned.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
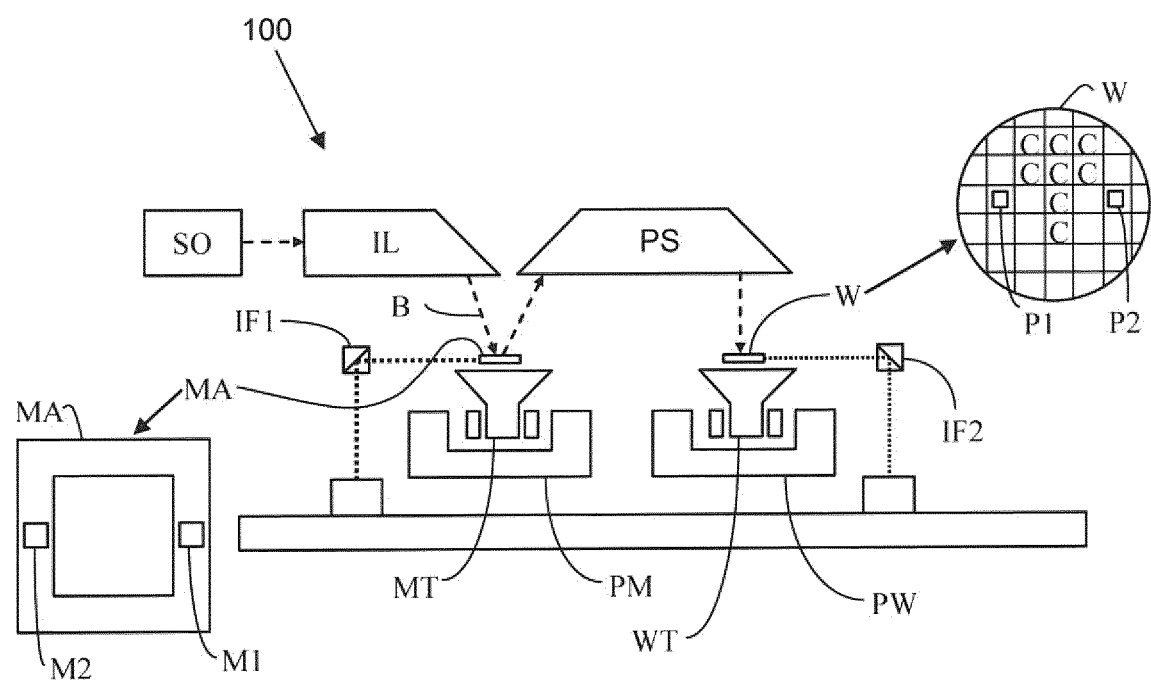
FIG. 1A is an illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
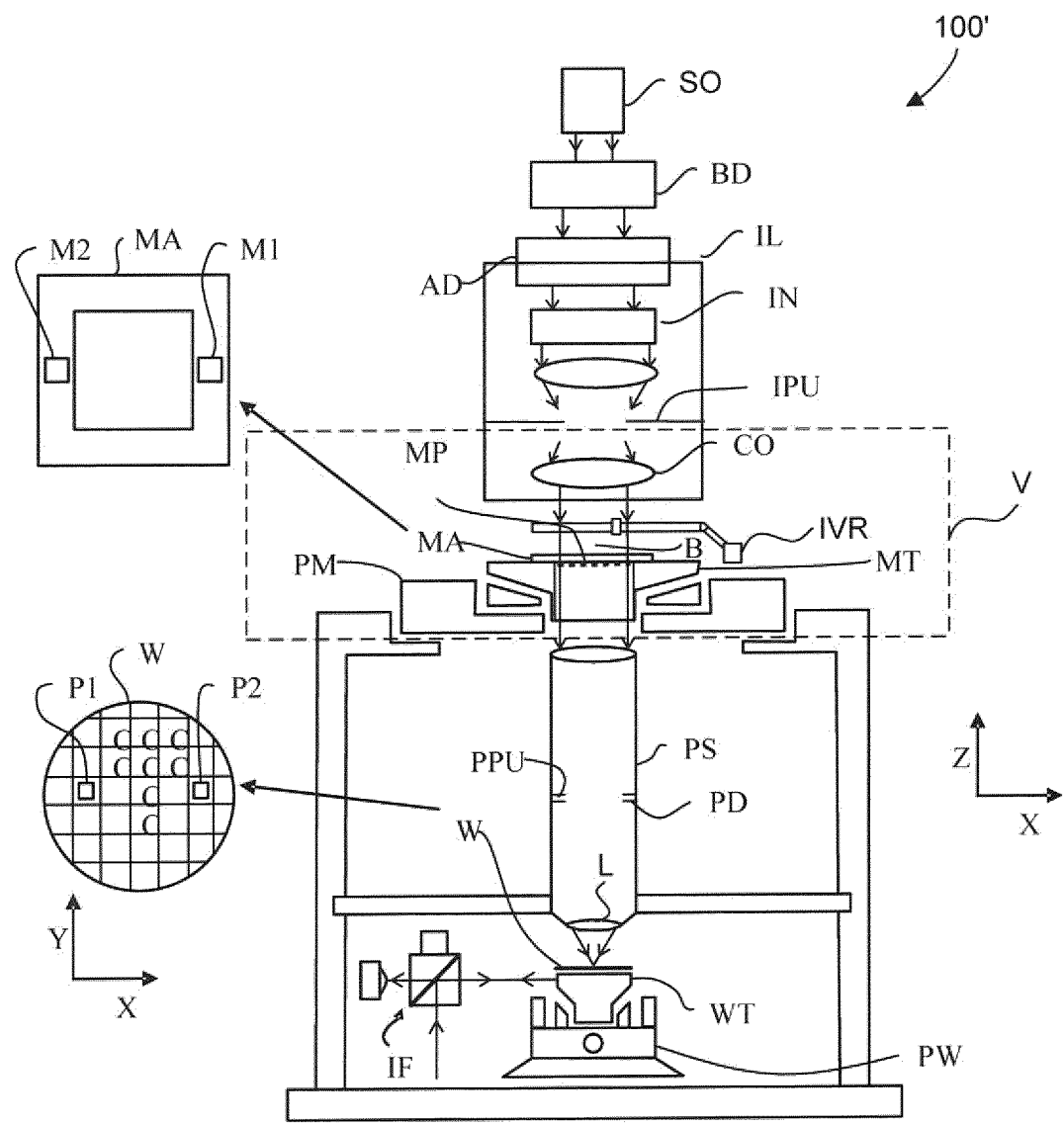
FIG. 1B is an illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate can be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
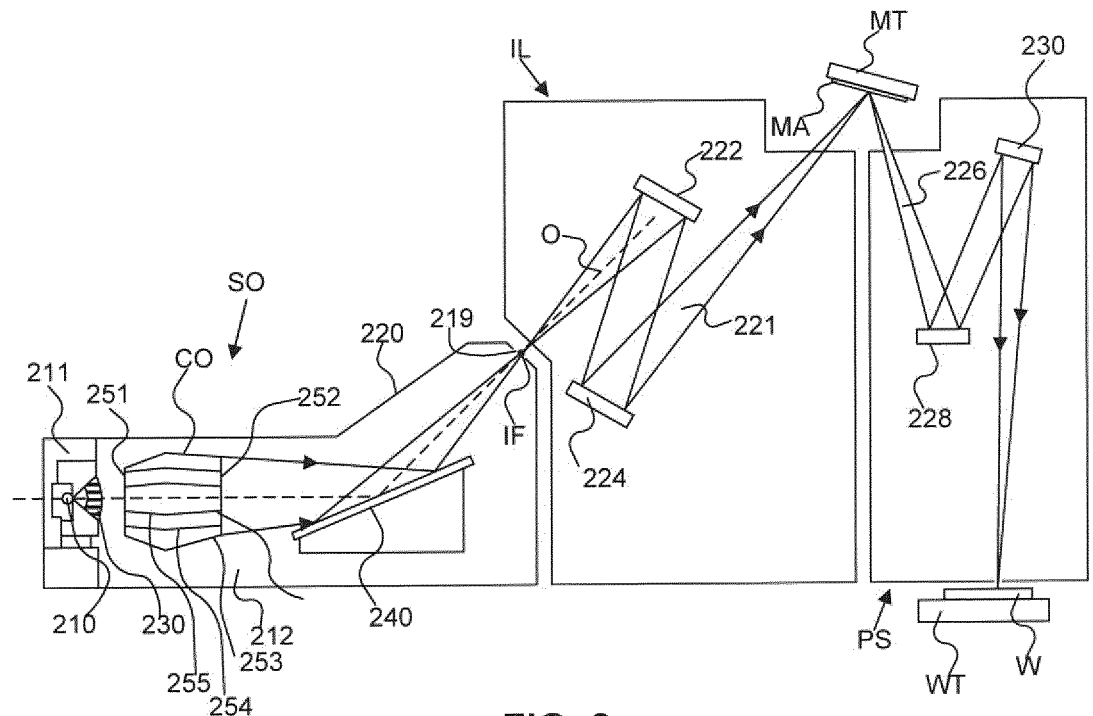
FIG. 2 is a more detailed illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
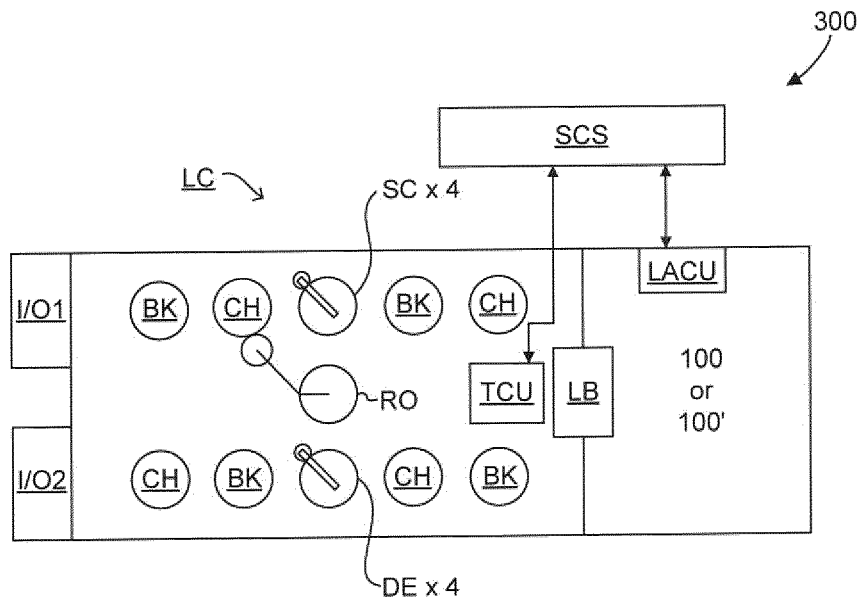
FIG. 3 is an illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
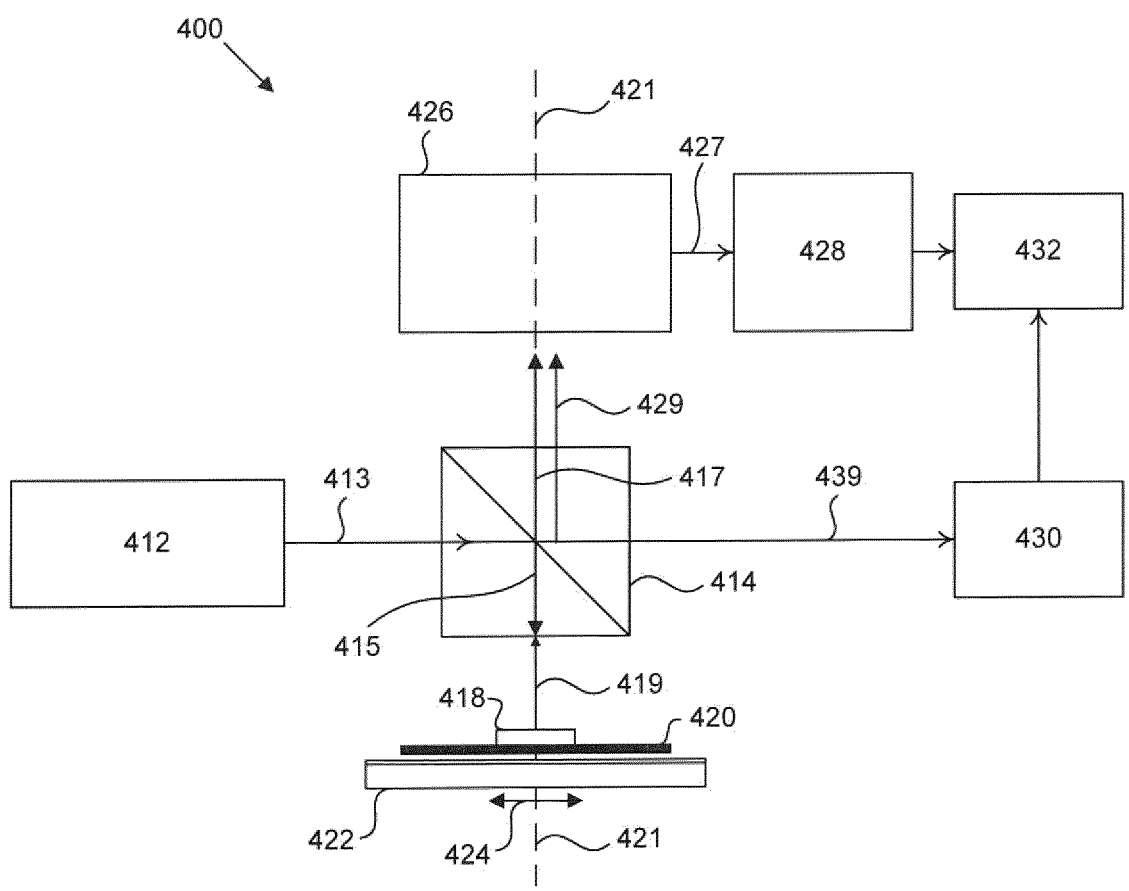
FIGS. 4A and 4B are illustrations of alignment apparatuses, according to various exemplary embodiments.

FIG. 4A illustrates a schematic of a cross-sectional view of an alignment apparatus 400 that can be implemented as a part of lithographic apparatus 100 or 100', according to an embodiment. In an example of this embodiment, alignment apparatus 400 can be configured to align a substrate (e.g., substrate W) with respect to a patterning device (e.g., patterning device MA). Alignment apparatus 400 can be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

According to an embodiment, alignment apparatus 400 may include an illumination system 412, a beam splitter 414, an interferometer 426, a detector 428, a beam analyzer 430, and an overlay calculation processor 432, according to an example of this embodiment. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., alignment apparatus 400) compared to the current alignment apparatuses.

Beam splitter 414 can be configured to receive radiation beam 413 and split radiation beam 413 into at least two radiation sub-beams, according an embodiment. In an example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from a knowledge of the printing step and/or other scatterometry processes.

Beam splitter 414 can be further configured to receive diffraction radiation beam 419 and split diffraction radiation beam 419 into at least two radiation sub-beams, according to an embodiment. In an example, diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In an embodiment, detector 428 can be configured to receive the recombined image via interferometer signal 427 and detect interference as a result of the recombined image when alignment axis 421 of alignment apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In an embodiment, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of alignment apparatus 400 or any other reference element such that the center of symmetry of alignment mark or target 418 can be known with reference to alignment apparatus 400 or any other reference element. Beam analyzer 430 can be a point or an imaging polarimeter with some form of wavelength-band selectivity. According to an embodiment, beam analyzer 430 can be directly integrated into alignment apparatus 400, or connected via fiber optics of several types: polarization preserving single mode, multimode, or imaging, according to other embodiments.

In an embodiment, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 may correspond to a movement of substrate 420 by stage 422. In an embodiment, the measured overlay data may also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In an embodiment, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
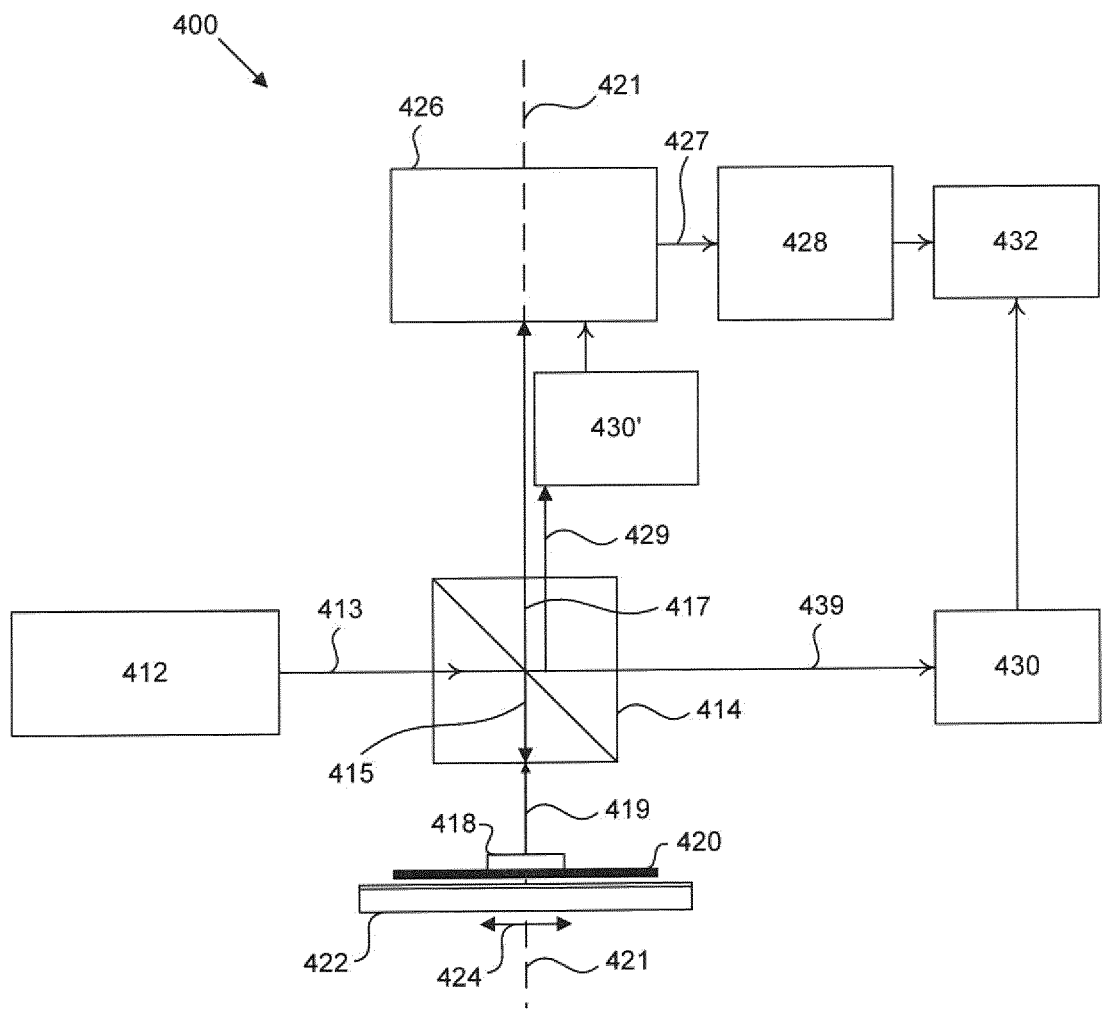

In an embodiment, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of alignment apparatus 400, or any other reference element, such that the center of symmetry of alignment mark or target 418 can be known with reference to alignment apparatus 400, or any other reference element. Second beam analyzer 430' can be further configured to determine the overlay data between two patterns and a model of the product stack profile of substrate 420. Second beam analyzer 430' may also be configured to measure overlay, critical dimension, and focus of target 418 in a single measurement.

In an embodiment, second beam analyzer 430' can be directly integrated into alignment apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In an embodiment, processor 432 receives information from detector 428 and beam analyzer 430. For example, processor 432 can be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the alignment apparatus 400 with reference to wafer marks and/or alignment marks 418.

In an embodiment, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 may group marks into sets of similar overlay error. The criteria for grouping marks can be adjusted based on different process controls, for example, different error tolerances for different processes.

In an embodiment, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Exemplary Illuminator Stability Apparatus

An alignment apparatus typically needs a stable illumination source comprising precision optical assemblies to measure positions on a substrate. Additionally, the alignment apparatus should be able to maintain its alignment despite any change in environmental conditions.

A typical illumination source for an alignment apparatus can be an optical fiber collimation assembly. The assembly can have an optical fiber and a lens system that are aligned to exhibit desired beam divergence, direction, and polarization. One way to maintain these characteristics can be to affix the components in place with glue or other adhesive material. But using glue can cause stability issues when there are environmental changes, such as temperature, pressure, humidity, or the like. One of the sensitivities of glue is that it may change dimensionally with changes in humidity, which may lead to drifts in the directionality and polarization of the radiation beam exiting the fiber collimator assembly. This can impact reliability in substrate positioning when the fiber collimator assembly is used as a light source for an alignment apparatus within a lithographic system.

Figure 5:
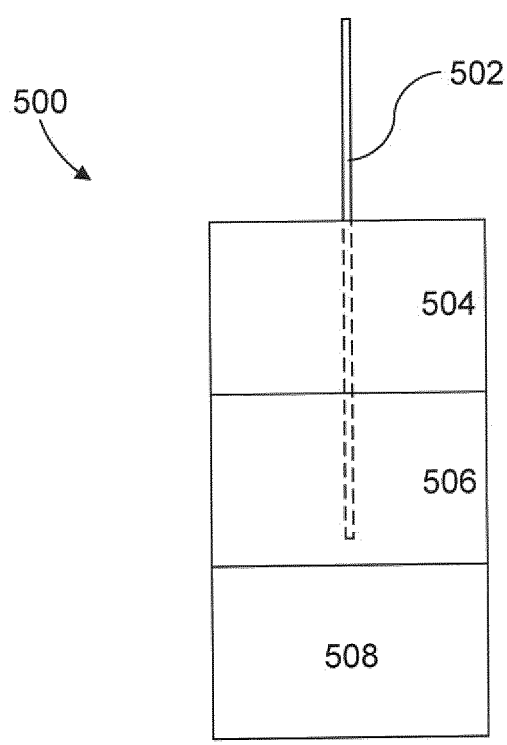
FIG. 5 is an illustration of a vertical cross section of an illuminator, according to an exemplary embodiment.

FIG. 5 illustrates a vertical cross-sectional view of an illuminator 500, according to an exemplary embodiment. In one example, illuminator 500 can be implemented as part of lithographic apparatus 100 (FIG. 1A) or 100' (FIG. 1B). In one example, illuminator 500 can be implemented in place of illuminator system 412 of alignment apparatus 400. In one example, illuminator 500 is an optical fiber collimation assembly comprising an optical fiber 502, a strain relief support 504, an optical fiber support 506, and an optical system support 508. In one example, optical fiber support 506 and optical system support 508 are configured to be modular.

As discussed above, optical fiber 502 can be secured to optical fiber support 506 through the use of adhesive material, such as glue. During operation, the glue might affect performance because adhesive material in load paths may cause instability of critical alignments. In this example, wafer alignment accuracy may degrade if illuminator 500, experiencing instabilities related to glue, is employed in alignment apparatus 400 (FIGS. 4A and 4B) within lithography apparatus 100 (FIG. 1A) or 100' (FIG. 1B). For example, illumination error can be dominated by a tilt of the radiation beam exiting illuminator 500 as a result of these instabilities. Other embodiments discussed herein use mechanical structures, e.g., glueless arrangements, to support alignment of critical optical components.

Figure 6:
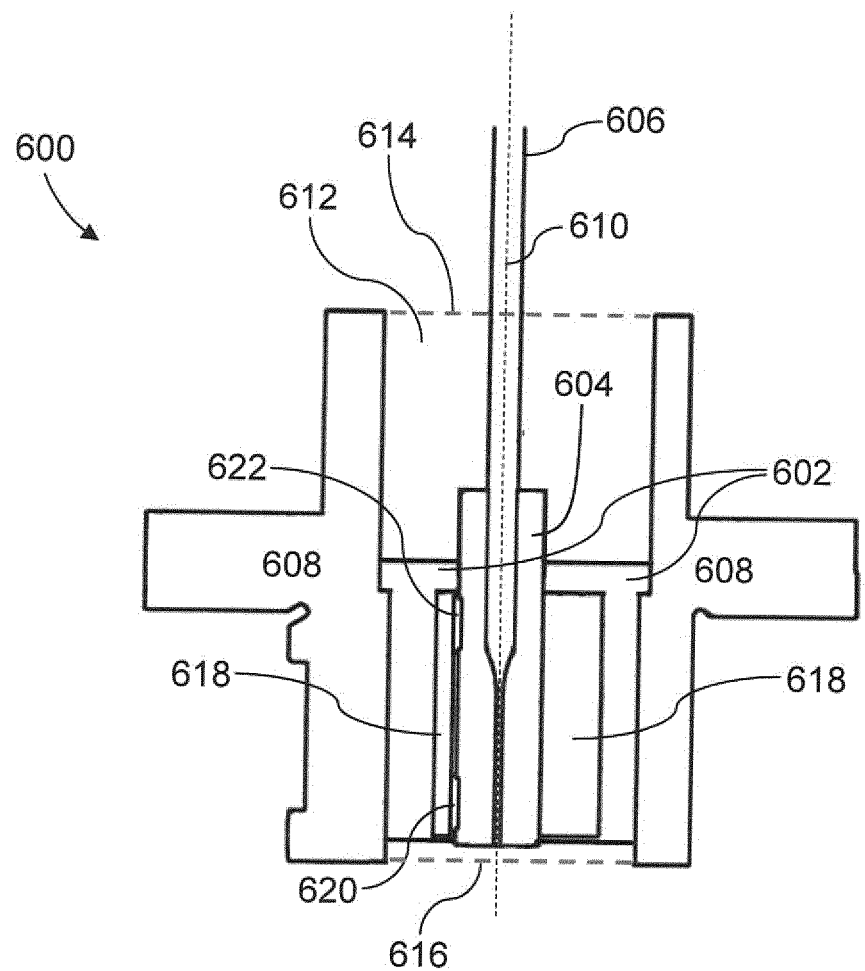
FIG. 6 is an illustration of a vertical cross section of an optical fiber support, according to an exemplary embodiment.

FIG. 6 illustrates a vertical cross-sectional view of an optical fiber support 600, according to an exemplary embodiment. In one example, optical fiber support 600 comprises a support arm assembly 602 configured to support an optical fiber protector 604 (e.g., a ferrule). In one example, an optical fiber 606 is inserted into optical fiber protector 604.

In one example, optical fiber protector 604 is manufactured with zirconium material, though in other examples they can be of ceramic or composite materials.

In one example, optical fiber support 600 is a cylindrically shaped body 608 having an optical axis 610 running through its center. In this example, body 608 includes an opening 612 running along optical axis 610, such that opening 612 is configured to receive optical fiber protector 604 and optical fiber 606. Additionally, an inlet opening 614 and an outlet opening 616 are formed in body 608 to receive connecting devices, for example, strain relief support 504 (FIG. 5) and optical system support 508 (FIG. 5). In this example, opening 616 is configured to allow radiation emitted by optical fiber 604 to exit optical fiber support 600.

In one example, support arm assembly 604 comprises one or more arms 618, e.g., flexure arms, kinematic flexure arms, contractable arms, or the like, that are configured to contact and support optic fiber protector 604. In one example, arms 618 are configured to allow translational and rotational position adjustments of optical fiber protector 604 and optical fiber 606 for adjusting beam properties (e.g., polarization) of radiation emitted by optical fiber 606.

In one example, each arm 618 can be configured to have a contiguous contact area that contacts the length of optical fiber protector 604. However, a contiguous contact area along each arm 618 may introduce instabilities in the alignment of fiber optic protector 604. So, in another example, each arm 618 is configured to contact optic fiber protector 604 at a lower contact area 620 and an upper contact area 622, which can increase alignment stability.

In one example, temperature changes are a concern since temperature changes can change dimensions of alignment critical components. Dimensional changes can be substantially reduced when using zirconium, titanium, or the like, for certain components since they exhibit coefficient of thermal expansion within an acceptable range. So, in one example, body 608, support arm assembly 602, and/or arms 618 are manufactured from these materials.

Figure 7:
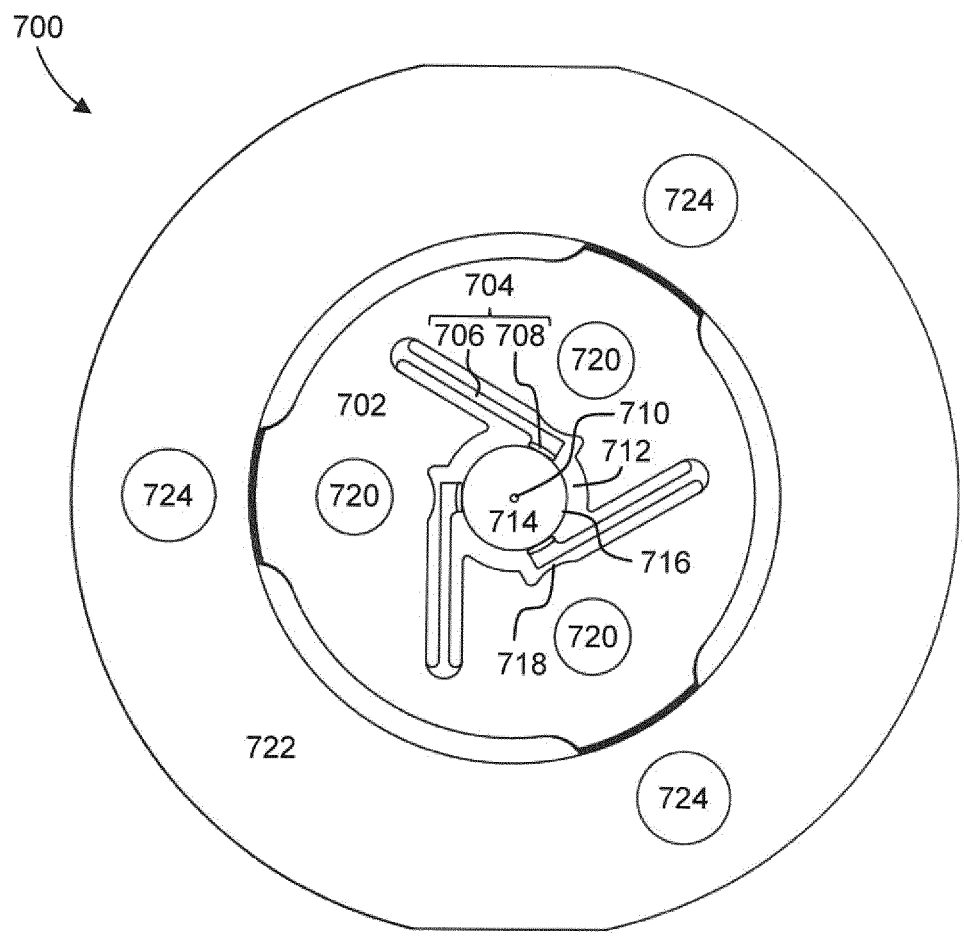
FIG. 7 is an illustration of an end view of an optical fiber support, according to an exemplary embodiment.

FIG. 7 illustrates an end view of an optical fiber support 700, according to an exemplary embodiment. In one example, optical fiber support 700 comprises a body 702 and three flexure arms 704, while other examples may employ more or less flexure arms 704. In one example, each flexure arm 704 comprises a flexure blade 706 and a contact pad 708. If thermal expansion coefficients of contact pads 708 are of concern, in one example, contact pads 708 may comprise the same material (e.g., titanium) as flexure arms 704 in a seamless structure having an L-shape.

In one example, flexure arms 704 are configured for spring action, i.e., to bend and restore to original positions, so as to operate kinematically (i.e., kinematic flexure arms).

In one example, body 702 has a cylindrical shape and has an optical axis 710 running through its center. In this example, body 702 includes an opening 712 running along optical axis 710 that is configured to receive an optical fiber protector 714.

In one example, flexure arms 704 are configured to contact optical fiber protector 714 tangentially around a circumference 716 of optic fiber protector 714. In one example, the spring actions of flexure arms 704 are configured such that contact pads 708 exert a contact pressure on optical fiber support 714 to hold in place optical fiber support 714 via friction, thereby precluding the need of glue to affix the position and alignment of optical fiber support 714, e.g., they are glueless.

In one example, body 702 comprises, for each flexure arm 704, a bumper 718. Bumper 718 is configured to absorb impact when flexure arms 704 are moved, for example, when inserting optical fiber protector 714.

In one example, body 702 comprises one or more threaded holes 720 configured to accept threaded fasteners (not shown) for coupling to another device, for example, optical system support 508. In one example, optical fiber support 700 comprises a flange 722 having one or more holes 724 configured to couple optical fiber support 700 to another device, for example, alignment apparatus 400 (FIGS. 4A and 4B).

Figure 8:
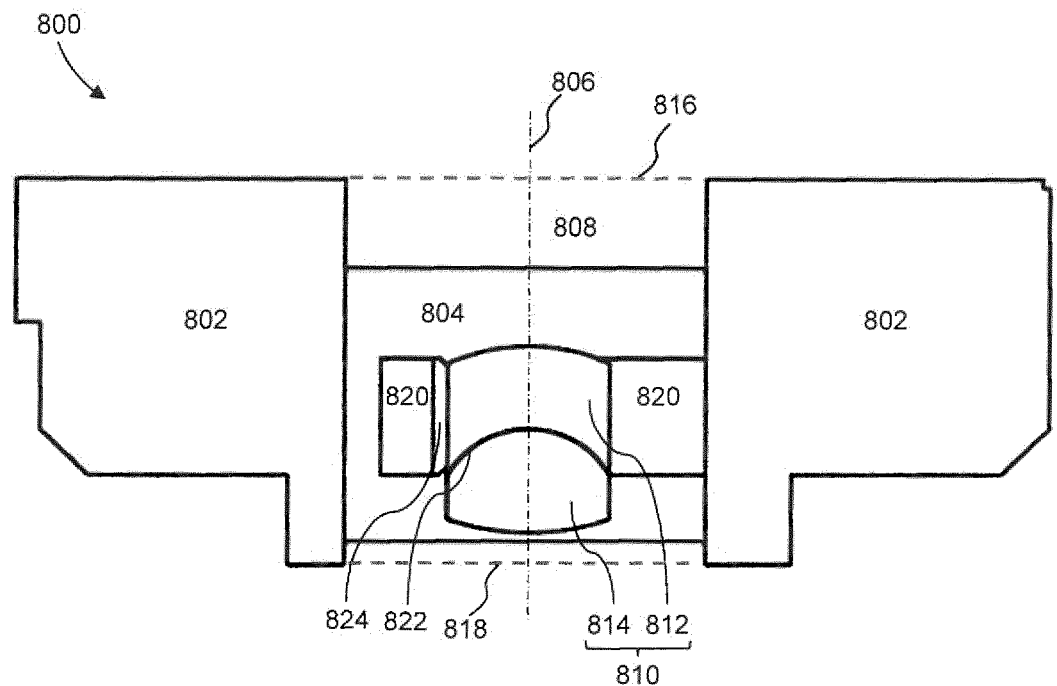
FIG. 8 is an illustration of a vertical cross section of an optical system support, according to an exemplary embodiment.

FIG. 8 is an illustration of a vertical cross-sectional view of an optical system support 800, according to an exemplary embodiment. In one example, optical system support 800 comprises a body 802 and a support arm assembly 804.

In one example, body 802 is a cylindrically shaped body, having an optical axis 806 running through its center. In this example, body 802 includes an opening 808 running along optical axis 806 that is configured to receive an optical system 810.

In one example, optical system 810 comprises a first lens 812 and a second lens 814 (e.g., a doublet lens).

In one example, body 802 comprises an inlet opening 816. Opening 816 can both receive another device, for example, optical fiber support 600 (FIG. 6), and allow radiation to enter optical system support 800, for example, radiation exiting optical fiber support 600 (FIG. 6). In this example, radiation entering through inlet opening 816 is configured to pass through optical system 810 along optical axis 806. In this example, optical fiber support 604 (FIG. 6) and optical fiber 606 (FIG. 6) are translationally and rotationally adjusted within optical support 600 (FIG. 6) to adjust beam collimation and polarization, respectively.

In one example, body 802 comprises an outlet opening 818 configured to allow radiation that has traversed through optical system 810 to exit optical system support 800.

In one example, support arm assembly 804 comprises one or more arms 820, e.g., flexure arms, kinematic flexure arms, contractable arms, or the like, that are configured to support optic system 810.

In one example, first lens 812 and second lens 814 are coupled with adhesive material, such as glue. In one example, pressure exerted by arms 820 on an interface 822 between first lens 812 and second lens 814 may cause changes in the relative alignment of first lens 812 and second lens 814, leading to changes in beam properties of radiation traversing optical system 810. Therefore, in this example, each arm 820 is configured to support optical system 810 by contacting first lens 812 on a contact area 824, which can substantially reduce or eliminate any strain across the interface 822 between first lens 812 and second lens 814. In another example, each arm 820 is configured to contact second lens 814.

Figure 9:
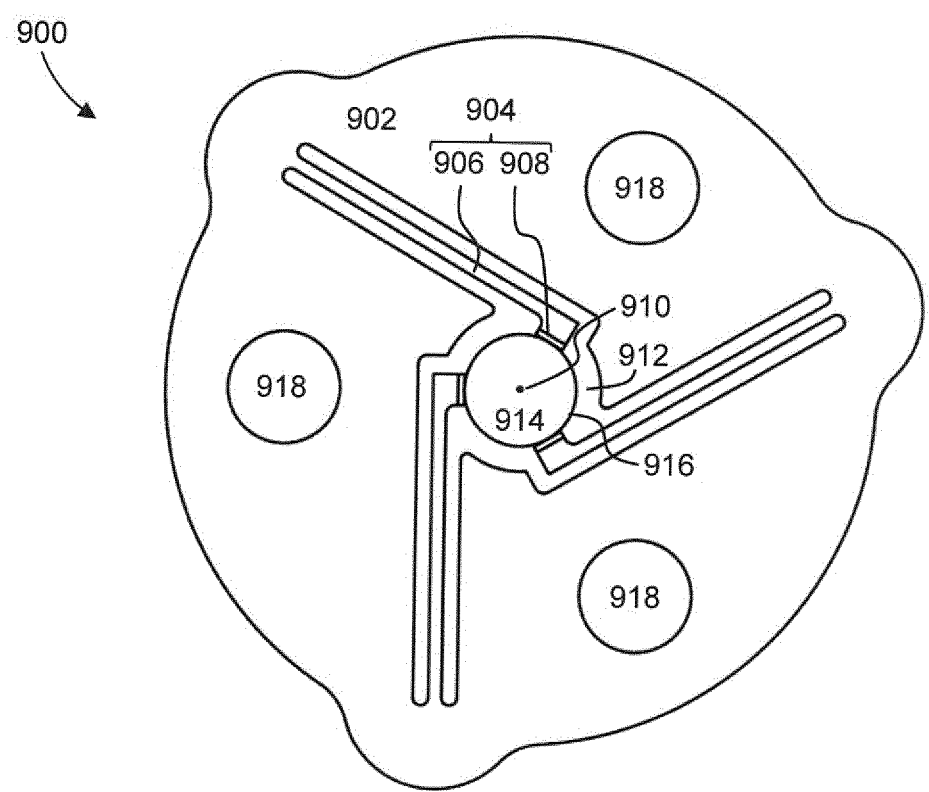
FIG. 9 is an illustration of an end view of an optical system support, according to an exemplary embodiment.

FIG. 9 illustrates an end view of an optical system support 900, according to an exemplary embodiment. In one example, optical fiber support 900 comprises a body 902. In this example, body 902 comprises three flexure arms 904, while other examples may employ more or less flexure arms 904. In one example, each flexure arm 904 comprises a flexure blade 906 and a contact pad 908. In one example, contact pads 908 comprise the same material (e.g., titanium) as flexure arms 904 in a seamless structure having an L-shape.

In one example, flexure arms 904 are configured to operate kinematically (i.e., kinematic flexure arms).

In one example, body 902 has a cylindrical shape and has an optical axis 910 running through its center. In this example, body 902 includes an opening 912 running along optical axis 910 that is configured to receive an optical system 914. Similar to the example discussed with respect to FIG. 8, optical system 914 may comprise first lens 812 and second lens 814.

In one example, flexure arms 904 are configured to contact optical system 914 tangentially around a circumference 916 of optical system 914. In one example, flexure arms 904 are configured such that contact pads 908 exert a contact pressure on optical system 914 to hold in place optical system 914 via friction, thereby precluding the need of glue to maintain the position and alignment of optical system 914, e.g., a glueless assembly.

In one example, optical components (e.g., lenses) are known to change optical properties under high clamping force loads. So, to substantially reduce or eliminate these effects in optical system 914, flexure arms 904 are configured to support optical system 914 by exerting a clamping force. In one example, a maximum clamping force may be approximately 0.61 N.

In one example, body 902 comprises one or more holes 918 configured to accept fasteners (not shown) for coupling to a device, for example, optical fiber support 700 (FIG. 7). In this example, optical system support 900 is configured to be translationally adjustable with respect to optical fiber support 700 (FIG. 7) in a plane perpendicular to optical axis 910, such that optical support 700 and optical system support 900 can be aligned along a shared optical axis.

Figure 10:
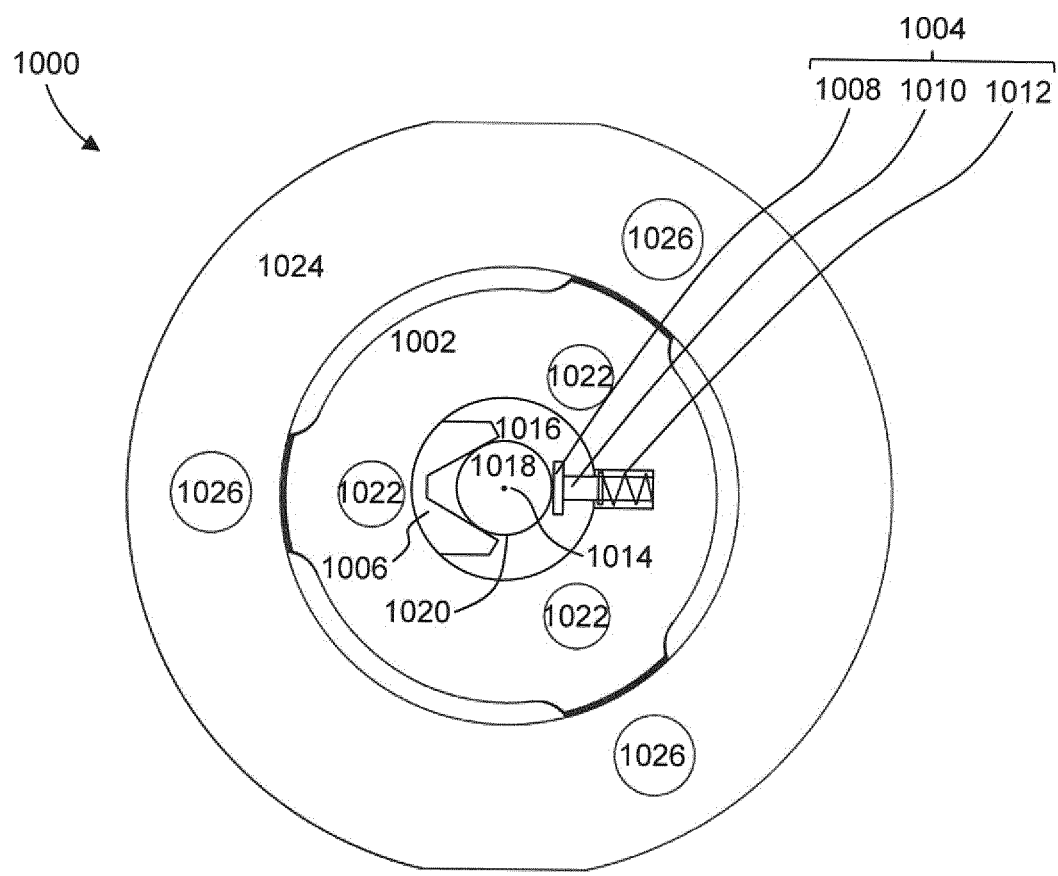
FIG. 10 is an illustration of an end view of an optical fiber support, according to an exemplary embodiment.

FIG. 10 illustrates an end view of an optical fiber support 1000, according to an exemplary embodiment. In one example, optical fiber support 1000 comprises a body 1002, a contractable arm 1004, and a support piece 1006.

In one example, contractable arm 1004 comprises a contact pad 1008, an arm 1010, and a contractable attachment 1012 (e.g., a spring, flexure, or the like). In one example, contractable attachment 1012 is configured to apply a spring force on contractable arm 1004.

In one example, support piece 1006 is a rigid and seamless structure of body 1002. In other examples, support piece 1006 can comprise one or more arms (not shown), contractable, flexure, or the like.

In one example, body 1002 is cylindrically shaped and has an optical axis 1014 running through its center. In this example, body 1002 includes an opening 1016 running along optical axis 1014 that is configured to receive an optical fiber protector 1018.

In one example, optical fiber protector 1018 is positioned between support piece 1006 and contact pad 1008. In one example, contractable arm 1004 and support piece 1006 are configured to contact optical fiber protector 1018 around a circumference 1020 of optical fiber protector 1018. In one example, support piece 1006 is V-shaped and configured to contact optical fiber protector 1018 at two contact locations so as to make optical fiber support 1000 more kinematic. In one example, contractable arm 1004 is configured such that contact pad 1008 and support piece 1006 exert a contact pressure on optical fiber protector 1018 to hold in place optical fiber protector 1018 via friction, thereby precluding the need of glue to affix the position and alignment of optical fiber protector, e.g., glueless.

In one example, body 1002 comprises one or more threaded holes 1022 configured to accept threaded fasteners for coupling to a device, for example, optical system support 508 (FIG. 5). In one example, optical fiber support 1000 comprises a flange 1024 having one or more holes 1026 configured to couple optical fiber support 1000 to an apparatus, for example, alignment apparatus 400 (FIG. 4).

Similar to the configuration and operation in which contractable arm 1004 and support piece 1006 support optical fiber support 1018, in one example, contractable arm 1004 and support piece 1006 can be configured to replace three flexure arms 904 (FIG. 9) in optical system support 900 (FIG. 9) to support optical system 914 (FIG. 9). As explained previously, optical system 914 (FIG. 9) may comprise lenses that are known to change optical properties under high clamping force loads. So, to substantially reduce or eliminate these effects, in this example, contractable arm 1004 and support piece 1006 are configured to support optical system 914 (FIG. 9) by exerting a clamping force. In one example, a maximum clamping force can be approximately 0.61 N.

In one example, glueless arm arrangements present a possibility that aligned optical components can become misaligned due to shock loads placed on illuminator 500 (FIG. 5), alignment apparatus 400 (FIGS. 4A and 4B), or lithographic apparatus 100 (FIG. 1A) or 100' (FIG. 1B). Examples of shock loads include, but are not limited to, shipment of product, impact by user, and impact by other objects. So, in one example, arms that support optical components (e.g., flexure arms 704 in FIG. 7, flexure arms 904 in FIG. 9, and contractable arm 1004 in FIG. 10), are configured to prevent alignment changes due to shock loads of up to 30 g.

Figure 11:
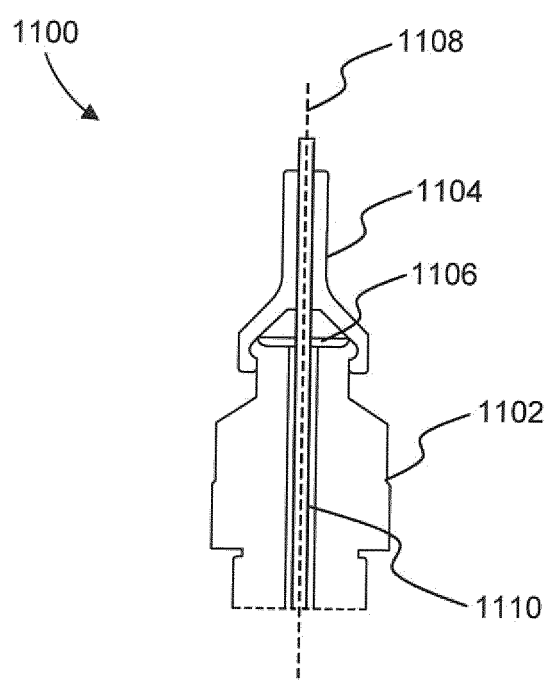
FIG. 11 is an illustration of a vertical cross section of a strain relief support, according to an exemplary embodiment.

FIG. 11 illustrates a vertical cross-sectional view of a strain relief support 1100, according to an exemplary embodiment. In one example, strain relief support 1100 is configured to connect to optical fiber support 600 (FIG. 6) through inlet opening 614 (FIG. 6) via threads (not shown). In this example, strain relief support 1100 is configured to absorb and dampen motion of optical fiber 606 (FIG. 6) such that optical fiber support 604 (FIG. 6) remains motionless within optical fiber support 600 (FIG. 6).

In one example, strain relief support 1100 comprises a strain relief housing 1102, a boot 1104, and one or more strain relief clips 1106. In one example, boot 1104 is manufactured from a flexible material configured to absorb and dampen shock and impacts. In one example, strain relief housing 1102 and boot 1104 are cylindrically shaped and have an optical axis 1108 running through their center. In this example, strain relief housing 1102 and boot 1104 include an opening running along optical axis 1108 that is configured to receive an optical fiber 1110.

In one example, the strain relief clips 1106 are configured to support, and prevent from moving, optical fiber 1112 within strain relief support 1100.

The embodiments may further be described using the following clauses:

1. A lithography system, comprising:
    an illumination system configured to produce a beam of radiation;
    a support configured to support a patterning device configured to impart a pattern on the beam;
    a projection system configured to project the patterned beam onto a substrate;
    an alignment system comprising an illuminator, the illuminator comprising:
        an optical fiber;
        an optical fiber protector;
        an optical fiber support comprising a first support arm assembly configured to support the optical fiber protector;
        an optical system; and
        an optical system support comprising a second support arm assembly configured to support the optical system.

2. The lithography system of clause 1, wherein the optical fiber and optical system supports are modular.

3. The lithography system of clause 1, wherein the optical fiber and optical system supports are coupled such that the optical fiber and the optical system are aligned.

4. The lithography system of clause 3, wherein the optical fiber and optical system supports are coupled via a threaded fastener.

5. The lithography system of clause 1, wherein the first support arm assembly comprises three flexures, each of the three flexures comprising a flexure blade and a contact pad.

6. The lithography system of clause 5, wherein the three flexures are configured to contact the optical fiber protector tangentially.

7. The lithography system of clause 5, wherein the three flexures are configured to operate kinematically.

8. The lithography system of clause 5, wherein each of the three flexures further comprises an L-shape.

9. The lithography system of clause 5, wherein the three flexures are configured to support the optical fiber protector by exerting a pressure below a threshold value to avoid changes of optical properties in the optical fiber.

10. The lithography system of clause 5, wherein the three flexures are configured to prevent alignment changes due to shock loads of up to 30 g.
11. The lithography system of clause 1, wherein the optical fiber protector is a ferrule.
12. The lithography system of clause 1, wherein the optical fiber support is a ferrule holder.
13. The lithography system of clause 1, wherein the second support arm assembly comprises three flexures, each of the three flexures comprising a flexure blade and a contact pad.
14. The lithography system of clause 13, wherein the three flexures are configured to contact the optical system tangentially.
15. The lithography system of clause 13, wherein the three flexures are configured to operate kinematically.
16. The lithography system of clause 13, wherein each of the three flexures further comprises an L-shape.
17. The lithography system of clause 13, wherein the three flexures are configured to support the optical system by exerting a pressure below a threshold value to avoid changes of optical properties in the optical system.
18. The lithography system of clause 13, wherein the three flexures are configured to prevent alignment changes due to shock loads of up to 30 g.
19. The lithography system of clause 1, wherein the optical system comprises a first and second lens.
20. The lithography system of clause 19, wherein the second support arm assembly contacts one of the first and second lenses.
21. The lithography system of clause 1, wherein the first support arm assembly comprises:
    a contractable arm comprising a contact pad; and
    a support piece.
22. The lithography system of clause 21, wherein the optical fiber protector is positioned between the contact pad and the support piece.
23. The lithography system of clause 21, wherein the contractable arm is configured to support the optical fiber protector by exerting a pressure below a threshold value to avoid changes of optical properties in the optical fiber.
24. The lithography system of clause 21, wherein the contractable arm and the support piece are configured to prevent alignment changes due to shock loads of up to 30 g.
25. The lithography system of clause 1, wherein the second support arm assembly comprises:
    a contractable arm comprising a contact pad; and
    a support piece.
26. The lithography system of clause 25, wherein the optical system is positioned between the contact pad and the support piece.
27. The lithography system of clause 25, wherein the contractable arm is configured to support the optical system by exerting a pressure below a threshold value to avoid changes of optical properties in the optical system.
28. The lithography system of clause 25, wherein the contractable arm and the support piece are configured to prevent alignment changes due to shock loads of up to 30 g.
29. The lithography system of clause 1, wherein the optical fiber and optical system supports are glueless.
30. The lithography system of clause 1, wherein the illuminator further comprises:
    a strain relief housing;
    a boot; and
    strain relief clips.
31. The lithography system of clause 30, wherein the strain relief housing is coupled to the optical fiber support via threads.
32. An illuminator comprising:
    an optical fiber;
    an optical fiber protector;
    an optical fiber support comprising a first support arm assembly configured to support the optical fiber protector;
    an optical system; and
    an optical system support comprising a second support arm assembly configured to support the optical system,
    wherein the optical fiber and optical system supports are modular and coupled such that an optical fiber and the optical system are aligned.
33. A method comprising:
    supporting an optical fiber using an optical fiber support comprising a first support arm assembly configured to exert a first contact pressure on an optical fiber protector; and
    supporting an optical system using an optical system support comprising a second support arm assembly configured to exert a second contact pressure on the optical system,
    wherein the optical fiber and optical system supports are coupled such that the optical fiber and optical system are aligned.
34. The method of clause 33, wherein the first and second support arm assemblies are configured to prevent alignment changes due to shock loads of up to 30 g.
35. The method of clause 33, wherein the first and second support arm assemblies are configured to operate kinematically.
36. The method of clause 33, wherein the first contact pressure is below a threshold value to avoid changes of optical properties in the optical fiber.
37. The method of clause 33, wherein the second contact pressure is below a threshold value to avoid changes of optical properties in the optical system.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Embodiments of the invention can be implemented in hardware, firmware, software, or any combination thereof. Embodiments of the invention may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A lithography system, comprising:
   an illumination system configured to produce a beam of radiation;
   a support configured to support a patterning device configured to impart a pattern on the beam;
   a projection system configured to project the patterned beam onto a substrate; and
   an alignment system comprising an illuminator, the illuminator comprising:
   an optical fiber;
   an optical fiber protector;
   an optical fiber support comprising a first support arm assembly configured to support the optical fiber protector;
   an optical system; and
   an optical system support comprising a second support arm assembly configured to support the optical system, wherein the optical system support is separate from the optical fiber support.

2. The lithography system of claim 1, wherein the optical fiber and optical system supports are modular.

3. The lithography system of claim 1, wherein the optical fiber and optical system supports are coupled such that the optical fiber and the optical system are aligned.

4. The lithography system of claim 3, wherein the optical fiber and optical system supports are coupled via a threaded fastener.

5. The lithography system of claim 1, wherein the first support arm assembly comprises three flexures, each of the three flexures comprising a flexure blade and a contact pad.

6. The lithography system of claim 5, wherein the three flexures are configured to contact the optical fiber protector tangentially.

7. The lithography system of claim 5, wherein the three flexures are configured to operate kinematically.

8. The lithography system of claim 5, wherein each of the three flexures further comprises an L-shape.

9. The lithography system of claim 5, wherein the three flexures are configured to support the optical fiber protector by exerting a pressure below a threshold value to avoid changes of optical properties in the optical fiber.

10. The lithography system of claim 5, wherein the three flexures are configured to prevent alignment changes due to shock loads of up to 30g.

11. The lithography system of claim 1, wherein the optical fiber protector is a ferrule.

12. The lithography system of claim 1, wherein the optical fiber support is a ferrule holder.

13. The lithography system of claim 1, wherein the second support arm assembly comprises three flexures, each of the three flexures comprising a flexure blade and a contact pad.

14. The lithography system of claim 13, wherein the three flexures are configured to contact the optical system tangentially.

15. The lithography system of claim 13, wherein the three flexures are configured to operate kinematically.

16. The lithography system of claim 13, wherein each of the three flexures further comprises an L-shape.

17. The lithography system of claim 13, wherein the three flexures are configured to support the optical system by exerting a pressure below a threshold value to avoid changes of optical properties in the optical system.

18. The lithography system of claim 13, wherein the three flexures are configured to prevent alignment changes due to shock loads of up to 30g.

19. The lithography system of claim 1, wherein the optical system comprises a first and second lens.

20. The lithography system of claim 19, wherein the second support arm assembly contacts one of the first and second lenses.

\* \* \* \* \*